US009336987B2

(12) United States Patent
Torikawa et al.

(10) Patent No.: US 9,336,987 B2

(45) Date of Patent: May 10, 2016

(54) CHARGED PARTICLE BEAM APPARATUS

(71) Applicant: HITACHI HIGH-TECH SCIENCE CORPORATION, Minato-ku, Tokyo (JP)

(72) Inventors: Shota Torikawa, Tokyo (JP); Tatsuya Asahata, Tokyo (JP); Makoto Sato, Tokyo (JP); Atsushi Uemoto, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 169 days.

(21) Appl. No.: 14/526,172

(22) Filed: Oct. 28, 2014

(65) Prior Publication Data

US 2015/0221473 A1 Aug. 6, 2015

(30) Foreign Application Priority Data

Oct. 30, 2013 (JP) ................................ 2013-225468

(51) Int. Cl.
*H01J 37/304* (2006.01)
*H01J 37/317* (2006.01)

(52) U.S. Cl.
CPC ..... *H01J 37/3045* (2013.01); *H01J 2237/3045* (2013.01); *H01J 2237/30438* (2013.01); *H01J 2237/3174* (2013.01); *H01J 2237/31749* (2013.01)

(58) Field of Classification Search
CPC ... H01J 37/222; H01J 37/244; H01J 37/3023; H01J 37/3026; H01J 37/304; H01J 37/3045; H01J 37/3171; H01J 37/3174
See application file for complete search history.

(56) References Cited

U.S. PATENT DOCUMENTS

| | | | | |
|---|---|---|---|---|
| 4,433,243 | A * | 2/1984 | Nakamura | H01J 37/302 219/121.32 |
| 2001/0003655 | A1* | 6/2001 | Tokunaga | B82Y 10/00 438/1 |
| 2004/0245464 | A1 | 12/2004 | Iwasaki et al. | 250/307 |
| 2013/0037724 | A1* | 2/2013 | Tsuruta | H01J 37/3045 250/397 |
| 2013/0147066 | A1* | 6/2013 | Cheng | H01L 22/12 257/797 |

FOREIGN PATENT DOCUMENTS

JP 2004361140 12/2004

* cited by examiner

*Primary Examiner* — Jack Berman
*Assistant Examiner* — David E Smith
(74) *Attorney, Agent, or Firm* — Adams & Wilks

(57) ABSTRACT

A charged particle beam apparatus including a column irradiating a sample with a charged particle beam, a detector detecting a secondary particle emitted from the sample, an image data generating section generating image data indicating two-dimensional distribution of an amount of the secondary particle detected by the detector, and a controller that respectively sets first and second position adjustment irradiation frames for first and second beam condition on a surface of the sample in the image data, form a first and second irradiation traces by respectively irradiating the first and second position adjustment irradiation frames with the charged particle beams of the first and second beam conditions, correct a position of the second processing irradiation frame, based on a position displacement amount between a predetermined position of the first irradiation trace and a predetermined position of the second irradiation trace.

6 Claims, 4 Drawing Sheets

CHARGED PARTICLE BEAM APPARATUS

CROSS-REFERENCE TO RELATED APPLICATIONS

This application claims priority from Japanese Patent Application No. 2013-225468 filed on Oct. 30, 2013, the entire contents of which are incorporated herein by reference.

TECHNICAL FIELD

Aspects of the present invention relate to a charged particle beam apparatus.

BACKGROUND

A method is known in which, when a process of irradiating a sample with focused ion beams to form a thin sample or the like is performed, using a detection image of a secondary electron or the like, a predetermined place is grasped by pattern matching which uses a mark for drift correction on a surface of the sample as a landmark and a sample thickness is measured by detection of electron transmittance or the like at the predetermined place (for instance, see JP-A-2004-361140).

SUMMARY

Incidentally, according to the method of the related art, there is a need to acquire the detection image of the secondary electron under various beam conditions (for instance, acceleration voltages and beam currents of ions, etc.) of the focused ion beams, which are set when the sample is processed. However, quality of the detection image may be deteriorated according to the beam conditions. For example, the quality may be deteriorated as the acceleration voltages are decreased or the beam currents are increased. When the quality of the detection image is deteriorated, a recognition error of an object on the detection image may be increased and the object may not be accurately recognized. For this reason, there are problems in that the sample thickness cannot be accurately measured and it is difficult to accurately process the sample.

The present invention has been made in view of the above problems, and an object thereof is to provide a charged particle beam apparatus capable of accurately processing a sample by ensuring a desired accuracy of an irradiation position, even when beam conditions of charged particle beams are changed.

According to an aspect of the present invention, there is provided a charged particle beam apparatus including: a stage configured to fix a sample; a charged particle beam column configured to irradiate the sample with a charged particle beam; a detector configured to detect a secondary particle emitted from the sample by the irradiation of the charged particle beam; an image data generating section configured to generate image data indicating two-dimensional distribution of an amount of the secondary particle detected by the detector, by converting the amount of the secondary particle into a luminance signal corresponding to an irradiation position of the charged particle beam on a surface of the sample; and a controller configured to: set a first processing irradiation frame and a first position adjustment irradiation frame for a first beam condition and a second processing irradiation frame and a second position adjustment irradiation frame for a second beam condition, which is different from the first beam condition, on the surface of the sample in the image data, form a first irradiation trace by irradiating the first position adjustment irradiation frame with the charged particle beam of the first beam condition and a second irradiation trace by irradiating the second position adjustment irradiation frame with the charged particle beam of the second beam condition by using the charged particle beam column, detect the first irradiation trace and the second irradiation trace by the irradiation of the charged particle beam, and correct a position of the second processing irradiation frame, based on a position displacement amount between a predetermined position of the first irradiation trace and a predetermined position of the second irradiation trace.

In accordance with the charged particle beam apparatus according to the above-described aspect, the first and second irradiation traces which are actually formed on the sample by the irradiation of the charged particle beams of the first and second beam conditions, which are different, on the first and second position adjustment irradiation frames can be accurately detected by the irradiation of the charged particle beam having a desired resolution. Consequently, correction accuracy may be improved and the sample may be accurately processed, for example, compared to a case in which a correction position for each of a plurality of beam conditions is corrected by using image data acquired under a plurality of beam conditions including, for example, beam conditions having a poor resolution.

DETAILED DESCRIPTION

Hereinafter, a charged particle beam apparatus according to an embodiment of the present invention will be described with reference to the accompanying drawings.

Figure 1:
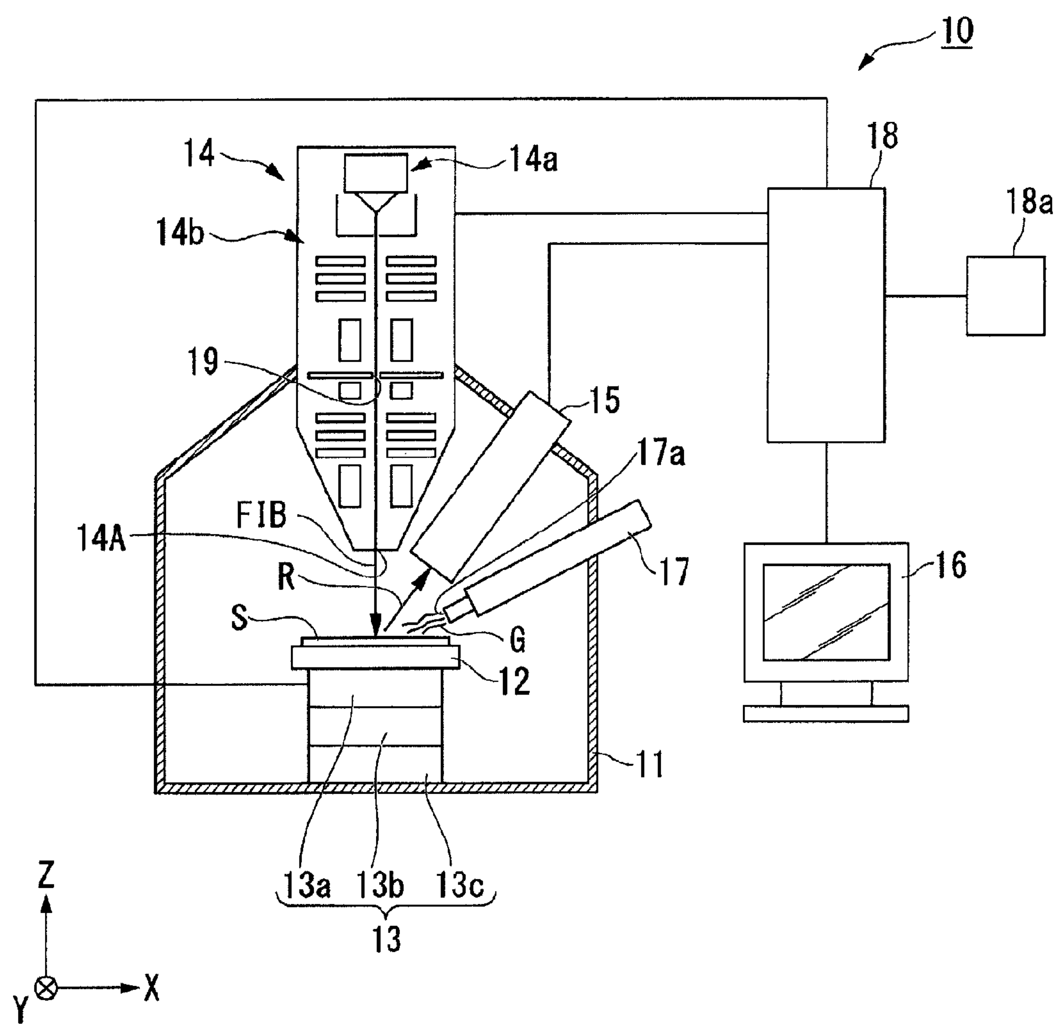
FIG. 1 is a view illustrating a configuration of a charged particle beam apparatus according to an embodiment of the present invention.

As shown in FIG. 1, a charged particle beam apparatus 10 according to an embodiment of the present invention includes a sample chamber 11 an inner portion of which is maintainable in a vacuum state, a stage 12 on which a sample S is fixable in the sample chamber 11, and a drive mechanism 13 which drives the stage 12. The charged particle beam apparatus 10 includes a focused ion beam column 14 which irradiates the sample S fixed onto the stage 12 with focused ion beams FIB, and a detector 15 which detects secondary charged particles R generated from the sample S by the irradiation of the focused ion beams. The charged particle beam apparatus 10 includes a display device 16 which displays image data or the like based on the secondary charged particles R detected by the detector 15, a gas supply unit 17 which supplies gas G onto a surface of the sample S, and a control unit 18.

The charged particle beam apparatus 10 according to the embodiment may perform various processes by sputtering (an etching process, etc.), observation of the surface of the sample S, and formation of a deposition film, by means of the scan and irradiation of the focused ion beams on the surface of the sample S configured of a semiconductor wafer, a semiconductor chip, or the like. For example, the charged particle beam apparatus 10 may perform a process of forming a cross section for cross-sectional observation at the sample S by a scanning electron microscope or the like, and a process of forming a sample for transmission observation (for instance, a thin sample, a needle-like sample, or the like) from the sample S by a transmission electron microscope.

The drive mechanism 13 is received in the sample chamber 11 in a state connected to the stage 12 and displaces the stage 12 relative to a predetermined axis according to control signals output from the control unit 18. The drive mechanism 13 includes a movement mechanism 13*a* moving the stage 12 in parallel along an X-axis and a Y-axis, which are parallel with a horizontal plane and orthogonal to each other, and a Z-axis which is orthogonal to the X-axis and the Y-axis. The drive mechanism 13 includes a tilt mechanism 13*b* which rotates the stage 12 about the X-axis or the Y-axis and a rotary mechanism 13*c* which rotates the stage 12 about the Z-axis.

A beam emitting section 14A of the focused ion beam column 14 faces the stage 12 at an upward position of the stage 12 in the vertical direction in the sample chamber 11, and an optical axis is vertically parallel to be fixed into the sample chamber 11. Thus, the focused ion beams may be radiated to the sample S fixed onto the stage 12 so as to be directed from the upward direction to the downward direction in the vertical direction.

The focused ion beam column 14 includes an ion source 14*a* which generates ions, and an ion optical system 14*b* which focuses and deflects the ions emitted from the ion source 14*a*. The ion source 14*a* and the ion optical system 14*b* are controlled according to the control signals output from the control unit 18, and irradiation positions, irradiation conditions, and the like of the focused ion beams are controlled by the control unit 18. The ion source 14*a* is, for example, a liquid metal ion source using liquid gallium or the like, a plasma ion source, an electric field ionization type gas ion source, or the like. The ion optical system 14*b* includes, for example, a first electrostatic lens such as a condenser lens, an electrostatic deflector, a second electrostatic lens such as an objective lens, etc.

The detector 15 detects intensities (amounts of secondary charged particles) of the secondary charged particles (for instance, secondary electrons, secondary ions, etc.) R radiated from the sample S when the focused ion beams are radiated to the sample S, and outputs information of the detected intensities of the secondary charged particles R. The detector 15 is arranged at a position capable of detecting the intensities of the secondary charged particles R, for example, at an obliquely upward position of the sample S or the like in the sample chamber 11, and is fixed into the sample chamber 11.

A gas injection section 17A of the gas supply unit 17 faces the stage 12 in the sample chamber 11 to be fixed into the sample chamber 11. The gas supply unit 17 may supply etching gas to selectively facilitate an etching of the sample S by the focused ion beams according to materials of the sample S, deposition gas to form a deposition film on the surface of the sample S by a deposit such as a metal or an insulator, and the like to the sample S. For example, the etching is selectively facilitated by the supply of the etching gas, such as xenon fluoride regarding an Si sample S or water regarding an organic sample S, together with the irradiation of the focused ion beams, to the sample S. In addition, for example, a solid component decomposed from the deposition gas is deposited on the surface of the sample S by the supply of the deposition gas, such as compound gas containing phenanthrene, platinum, carbon, tungsten, or the like, together with the irradiation of the focused ion beams, to the sample S.

The control unit 18 is arranged outside the sample chamber 11 and includes an input section 18*a* which outputs signals according to an input operation of an operator.

The control unit 18 comprehensively controls the operation of the charged particle beam apparatus 10 by means of signals output from the input section 18*a*, signals generated by a preset automatic operation control process, or the like.

The control unit 18 controls beam conditions of the focused ion beams. The beam conditions are acceleration voltage of the ion emitted from the ion source 14*a*, and a lens voltage of the ion optical system 14*b* or limiting by an aperture 19. The aperture 19 has opening sections capable of being set to a plurality of different diameters, and the beams are limited according to the diameters of the opening sections.

Figure 2:
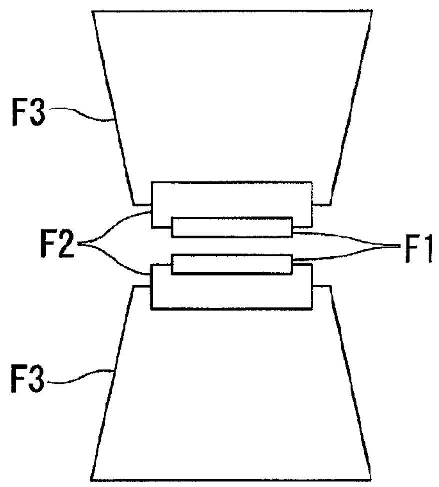
FIG. 2 is a view illustrating an example of each processing frame in a rough process, an intermediate process, and a finishing process of the charged particle beam apparatus according to the embodiment of the present invention.

Consequently, it may be possible to properly change beam currents and beam diameters of the focused ion beams suitable for types of processes such as a rough process, an intermediate process, and a finishing process, irradiation positions of the focused ion beams on the surface of the sample S, and the like. For example, as shown in FIG. 2, when a process of creating a cross section is performed, a relatively large processing frame F3 is set with respect to beam conditions in the rough process by relatively high beam currents in order to largely process the front of the created cross section. Next, a processing frame F2 which is relatively smaller than the processing frame F3 is set with respect to beam conditions in the intermediate process by relatively intermediate beam currents. Next, a processing frame F1 which is relatively smaller than the processing frame F2 is set with respect to beam conditions in the finishing process by relatively small beam currents.

In addition, for example, the control unit 18 controls a position, a posture, and the like of the sample S arranged on the stage 12 relative to irradiation axes of the focused ion beams, by means of the drive mechanism 13.

In addition, for example, the control unit 18 generates image data indicating two-dimensional distribution of the intensities of the secondary charged particles R and controls display of the image data on the display device 16, by converting the intensities of the secondary charged particles R detected by the detector 15 into luminance signals corresponding to the irradiation positions of the focused ion beams on the surface of the sample S.

In addition, for example, the control unit 18 corrects displacements of the irradiation positions according to the beam conditions of the focused ion beams by using the image data indicating the two-dimensional distribution of the intensities of the secondary charged particles R. In more detail, prior to performing various processes to the sample S by using the focused ion beams of a plurality of preset beam conditions, a plurality of position adjustment irradiation frames which are different for each of the plurality of beam conditions are set so that correction amounts for correcting the displacements of the irradiation positions of the plurality of beam conditions are set. Moreover, the plurality of position adjustment irradiation frames are set, for example, by using a region which does not interfere with the various processes on the surface of the sample S or by using an appropriate reference sample other than the sample S. When the various processes are actually performed to the sample S, the irradiation positions of the focused ion beams are first corrected by the ion optical system 14*b* depending on the plurality of beam conditions by using the correction amounts set according to the plurality of position adjustment irradiation frames. Here, each of the position adjustment irradiation frames are for showing a predetermined irradiation position on an observation image, and is not limited to the frame. For example, the position adjustment irradiation frame may also be a point, a line, or other shapes.

Figure 3A:
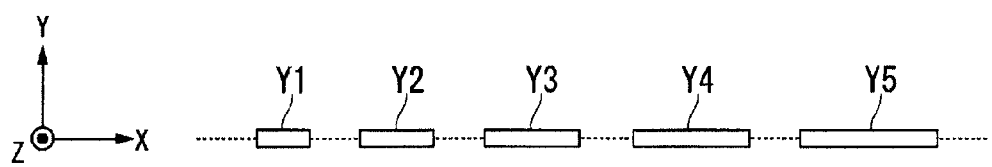
FIG. 3A is a view illustrating a plurality of position adjustment irradiation frames set on a surface of a sample when an irradiation position is corrected in a Y direction in the charged particle beam apparatus according to the embodiment of the present invention.

For example, when displacements of the irradiation positions in the Y-axis direction in the X-axis and the Y-axis forming a two-dimensional coordinate system on the surface of the sample S are adjusted, image data indicating two-dimensional distribution of intensities of secondary charged particles R detected by the detector 15 is first generated by irradiating the sample S with focused ion beams of a beam condition for observation having a desired resolution. The beam condition for observation having a desired resolution is, for example, a lens voltage configured such that an acceleration voltage of an ion is maximized and a beam current is equal to or less than a predetermined current, or the like. As shown in FIG. 3A, irradiation frames Y1, . . . , Yn for adjustment of a plurality of first to nth Y-coordinate positions, which have a linear shape and extend in the X-axis direction at a predetermined Y-coordinate position on the surface of the sample S in the image data, are set. The predetermined Y-coordinate position is, for example, a central position of a display screen in the vertical direction (Y-axis direction) of the image data, or the like. Thus, scan directions of the focused ion beams are set in the X-axis direction (horizontal direction of image data). Here, it is not limited to a linear shape and may also be in a range having a finite width.

In addition, focused ion beams of a plurality of first to nth beam conditions which are different for each of the irradiation frames Y1, . . . , Yn for adjustment of the plurality of first to nth Y-coordinate positions are radiated to the sample S by the focused ion beam column 14 so as to be scanned in the X-axis direction. Consequently, a plurality of irradiation traces YA (YA1, . . . , YAn) are formed on the surface of the sample S according to the focused ion beams of the plurality of first to nth beam conditions.

Figure 3B:
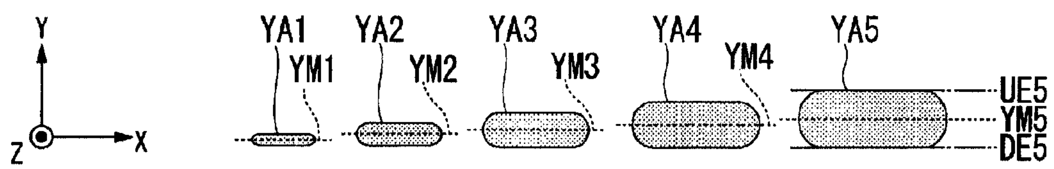
FIG. 3B is a view illustrating a plurality of irradiation traces formed on the sample by irradiation of focused ion beams of a plurality of beam conditions which are different for each of the plurality of position adjustment irradiation frames.

In addition, the image data indicating the two-dimensional distribution of the intensities of the secondary charged particles R detected by the detector 15 is generated by irradiating the sample S with the focused ion beams of the beam conditions for observation having a desired resolution. As shown in FIG. 3B, an upper end horizontal edge UE (UE1, . . . , UEn) and a lower end horizontal edge DE (DE1, . . . , DEn) of each irradiation trace YA (YA1, . . . , YAn) of the focused ion beams of the plurality of first to nth beam conditions are extracted by processing of edge extraction using a luminance value of the image data. The upper end horizontal edge UE is an edge which extends in an image horizontal direction at an upper end of the irradiation trace YA in an image vertical direction thereof. The lower end horizontal edge DE is an edge which extends in the image horizontal direction at a lower end of the irradiation trace YA in the image vertical direction thereof. A Y-coordinate median line YM (YM1, . . . , YMn), which extends in the image horizontal direction at a center between the upper end horizontal edge UE and the lower end horizontal edge DE, is detected.

Figure 3C:
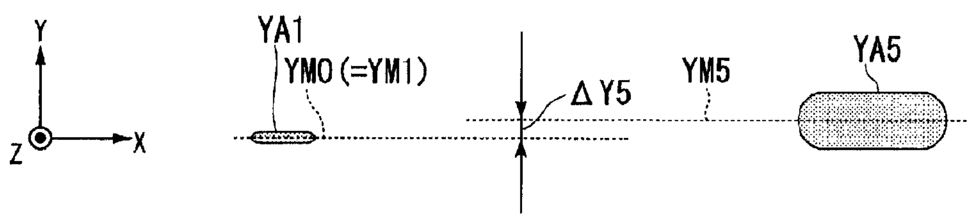
FIG. 3C is a view illustrating a correction amount of an irradiation position for each of the plurality of beam conditions.

In addition, as shown in FIG. 3C, a proper beam condition (for instance, a first beam condition) among the plurality of first to nth beam conditions is set as a reference beam condition. The Y-coordinate median line YM of the reference beam condition is set as a reference Y-coordinate median line YM0, and a displacement amount (a Y-coordinate displacement amount) ΔY (ΔY1, . . . , ΔYn) of the Y-coordinate median line YM of the other beam condition with respect to the reference Y-coordinate median line YM0 is calculated. The Y-coordinate displacement amount ΔY (ΔY1, . . . , ΔYn) for each of the plurality of first to nth beam conditions is set as a correction amount of an irradiation position. Here, instead of the median line, the upper end horizontal edge and the lower end horizontal edge may also be used.

Figure 4A:
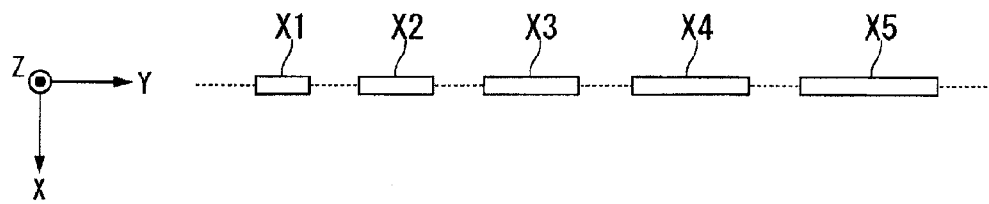
FIG. 4A is a view illustrating a plurality of position adjustment irradiation frames set on a surface of a sample when an irradiation position is corrected in an X direction in the charged particle beam apparatus according to the embodiment of the present invention.

Similarly, when displacements of the irradiation positions in the X-axis direction are adjusted for example, image data indicating two-dimensional distribution of intensities of secondary charged particles R detected by the detector 15 is first generated by irradiating the sample S with focused ion beams of beam conditions for observation having a desired resolution. As shown in FIG. 4A, irradiation frames X1, . . . , Xn for adjustment of a plurality of first to n X-coordinate positions, which have a linear shape and extend in the Y-axis direction at a predetermined X-coordinate position on the surface of the sample S in the image data, are set. Moreover, the predetermined X-coordinate position is, for example, a central position of a display screen in the horizontal direction (X-axis direction) of the image data, or the like. Thus, scan directions of the focused ion beams are set in the Y-axis direction (vertical direction of image data).

In addition, focused ion beams of a plurality of first to nth beam conditions which are different for each of the irradiation frames X1, . . . , Xn for adjustment of the plurality of first to n X-coordinate positions are radiated to the sample S by the focused ion beam column 14 so as to be scanned in the Y-axis direction. Consequently, a plurality of irradiation traces XA (XA1, . . . , XAn) are formed on the surface of the sample S according to the focused ion beams of the plurality of first to n beam conditions.

Figure 4B:
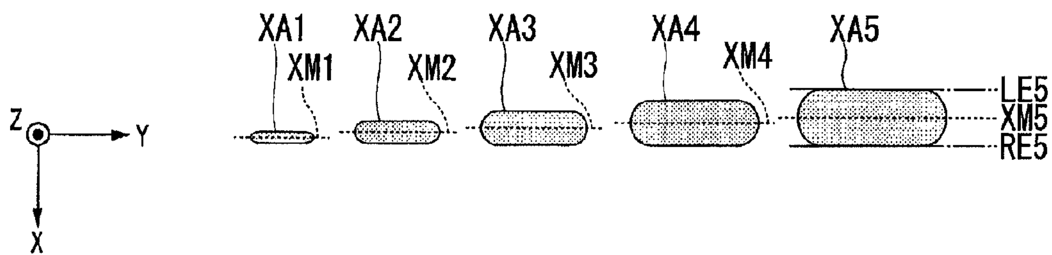
FIG. 4B is a view illustrating a plurality of irradiation traces formed on the sample by irradiation of focused ion beams of a plurality of beam conditions which are different for each of the plurality of position adjustment irradiation frames.

In addition, the image data indicating the two-dimensional distribution of the intensities of the secondary charged particles R detected by the detector 15 is generated by irradiating the sample S with the focused ion beams of the beam conditions for observation having a desired resolution. As shown in FIG. 4B, a left end vertical edge LE (LE1, . . . , LEn) and a right end vertical edge RE (RE1, . . . . , REn) of each irradiation trace XA (XA1, . . . , XAn) of the focused ion beams of the plurality of first to n beam conditions are extracted by processing of edge extraction using a luminance value of the image data. The left end vertical edge LE is an edge which extends in an image vertical direction at a left end of the irradiation trace XA in an image horizontal direction thereof. The right end vertical edge RE is an edge which extends in the image vertical direction at a right end of the irradiation trace XA in the image horizontal direction thereof. An X-coordinate median line XM (XM1, . . . , XMn), which extends in the image vertical direction at a center between the left end vertical edge LE and the right end vertical edge RE, is detected.

Figure 4C:
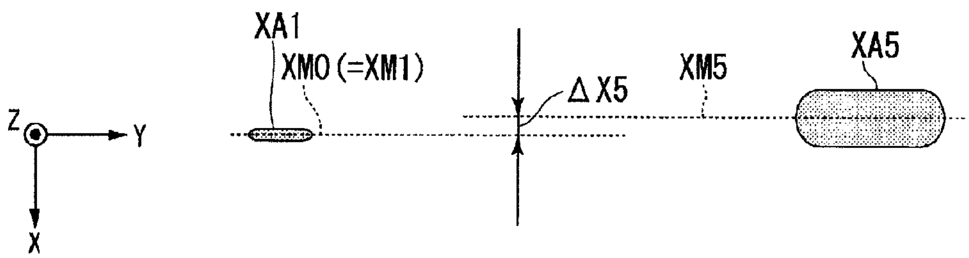
FIG. 4C is a view illustrating a correction amount of an irradiation position for each of the plurality of beam conditions.

In addition, as shown in FIG. 4C, a proper beam condition (for instance, a first beam condition) among the plurality of first to nth beam conditions is set as a reference beam condition. The X-coordinate median line XM of the reference beam condition is set as a criteria X-coordinate median line XM0, and a displacement amount (a X-coordinate displacement amount) ΔX (ΔX1, . . . , ΔXn) of the X-coordinate median line XM of the other beam condition with respect to the reference X-coordinate median line XM0 is calculated. The X-coordinate displacement amount ΔX (ΔX1, . . . , ΔXn) for each of the plurality of first to n beam conditions is set as a correction amount of an irradiation position.

The charged particle beam apparatus 10 according to the embodiment of the present invention has the above configurations. Hereinafter, an operation of the charged particle beam apparatus 10, and particularly, a processing of setting a correction amount of an irradiation position for each of the plurality of beam conditions of focused ion beams will be described.

Figure 5:
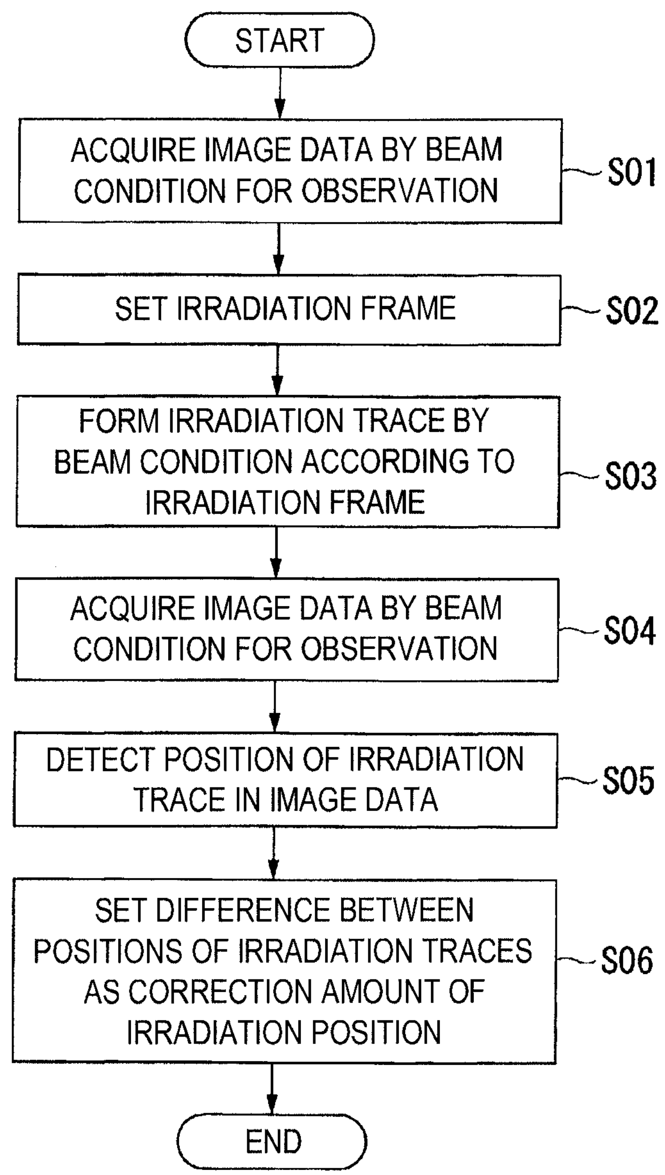
FIG. 5 is a flowchart illustrating an operation of the charged particle beam apparatus according to the embodiment of the present invention, and particularly, a processing of setting the correction amount of the irradiation position for each of the plurality of beam conditions of the focused ion beam.

First, in step S01 shown in FIG. 5 for example, image data indicating two-dimensional distribution of intensities of the secondary charged particles R detected by the detector 15 is acquired by irradiating the sample S with the focused ion beams of the beam conditions for observation having a desired resolution.

Next, in step S02, the plurality of position adjustment irradiation frames are set in accordance with a desired direction in which the irradiation position is corrected on a surface of the sample S in the acquired image data.

Next, in step S03, focused ion beams of beam conditions which are different for each of the plurality of position adjustment irradiation frames are radiated so that a plurality of irradiation traces are formed on the surface of the sample S.

Next, in step S04, image data indicating two-dimensional distribution of intensities of the secondary charged particles R detected by the detector 15 is acquired by irradiating the sample S with focused ion beams of beam conditions for observation having a desired resolution.

Next, in step S05, each irradiation trace is detected by performing an image processing in which each irradiation trace is regarded as a detection object with respect to the acquired image data, and a central position of each irradiation trace in a desired direction in which the irradiation position is corrected is detected.

Next, in step S06, any one of the plurality of beam conditions is set as a reference beam condition, and a difference between a central position of an irradiation trace of the other beam condition to the central position of the irradiation trace of the reference beam condition in the desired direction is set as the correction amount of the irradiation position. Subsequently, the processing is ended.

As described above, in accordance with the charged particle beam apparatus 10 according to the embodiment of the present invention, even though the displacements of the irradiation positions are caused, the displacements may be accurately corrected according to the changes of the beam conditions of the focused ion beams by the first electrostatic lens and the electrostatic deflector of the ion optical system 14*b* for example. In more detail, the plurality of irradiation traces actually formed on the sample (the sample S or the reference sample) by the irradiation of the focused ion beams of the plurality of beam conditions which are different for each of the plurality of respective position adjustment irradiation frames may accurately be detected by the irradiation of the focused ion beams for observation having the desired resolution. Consequently, correction accuracy can be improved, for example, compared to a case in which the correction position for each of the plurality of beam conditions is corrected by using image data acquired under the plurality of beam conditions including, for example, beam conditions having a poor resolution. In addition, the sample S can be accurately processed, for example, even though various processes are performed while the beam conditions of the focused ion beams radiated to the sample S are changed in an automatic and continuous manner according to a preset program or according to signals or the like output from an input section 18*a* by an input operation of an operator.

Furthermore, a correction amount of an irradiation position with respect to a Y direction (or an X direction) may be accurately set by using each position adjustment irradiation frame having a linear shape and extending in the X direction (or the Y direction) orthogonal to the Y direction (or the X direction) in which the irradiation position is corrected, and correction accuracy can be improved.

Furthermore, in the display screen on which image data is displayed by a display device 16, in a case where the display error is increased as a distance from the central position is increased, the correction amount of the irradiation position can be accurately set by setting each position adjustment irradiation frame to the central position on the display screen compared to a case, for example, in which each position adjustment irradiation frame is set to a position displaced from the central position on the display screen.

Although embodiments have been described with reference to a number of illustrative embodiments thereof, it should be understood that numerous other modifications and embodiments can be devised by those skilled in the art that will fall within the spirit and scope of the principles of this disclosure. That is, the configuration of the above embodiment is only one example and proper variations and modifications can be made.

For example, in the above embodiment, although the correction amount of the irradiation position has been described to be set for each of the preset plurality of beam conditions, correction amounts of irradiation positions are preferably set to all beam conditions used when various processed are actually performed to a sample S.

In addition, for example, in the above embodiment, when the preset plurality of beam conditions are a predetermined number or more and the position adjustment irradiation frame of all beam conditions cannot be set in the same display screen of the display device 16, the plurality of position adjustment irradiation frames may be set in a manner of being divided into a plurality of display screens. In this case, it is preferable that the position adjustment irradiation frame of the reference beam condition is commonly set on the plurality of display screens.

In addition, for example, in the above embodiment, although each of the plurality of position adjustment irradiation frames has a linear shape extending in a direction orthogonal to the desired direction in which the irradiation position is corrected, the present invention is not limited thereto. For example, the position adjustment irradiation frame may also have other shapes.

In addition, for example, in the above embodiment, although the position adjustment irradiation frame has a shape according to the desired direction in which the irradiation position is corrected, the present invention is not limited thereto. For example, the position adjustment irradiation frame may also have a common shape independent of the desired direction in which the irradiation position is corrected.

The present invention provides illustrative, non-limiting aspects as follows:

(1) In a first aspect, there is provided a charged particle beam apparatus including: a stage configured to fix a sample; a charged particle beam column configured to irradiate the sample with a charged particle beam; a detector configured to detect a secondary particle emitted from the sample by the irradiation of the charged particle beam; an image data generating section configured to generate image data indicating two-dimensional distribution of an amount of the secondary particle detected by the detector, by converting the amount of the secondary particle into a luminance signal corresponding to an irradiation position of the charged particle beam on a surface of the sample; and a controller configured to: set a first processing irradiation frame and a first position adjustment irradiation frame for a first beam condition and a second processing irradiation frame and a second position adjustment irradiation frame for a second beam condition, which is different from the first beam condition, on the surface of the sample in the image data, form a first irradiation trace by irradiating the first position adjustment irradiation frame with the charged particle beam of the first beam condition and a second irradiation trace by irradiating the second position adjustment irradiation frame with the charged particle beam of the second beam condition by using the charged particle beam column, detect the first irradiation trace and the second irradiation trace by the irradiation of the charged particle beam, and correct a position of the second processing irradiation frame, based on a position displacement amount between a predetermined position of the first irradiation trace and a predetermined position of the second irradiation trace.

Accordingly, the first and second irradiation traces which are actually formed on the sample by the irradiation of the charged particle beams of the first and second beam conditions, which are different, on the first and second position adjustment irradiation frames can be accurately detected by the irradiation of the charged particle beam having a desired resolution. Consequently, correction accuracy may be improved and the sample may be accurately processed, for example, compared to a case in which a correction position for each of a plurality of beam conditions is corrected by using image data acquired under a plurality of beam conditions including, for example, beam conditions having a poor resolution.

(2) In a second aspect, there is provided the charged particle beam apparatus according to the first aspect, wherein each of the first beam condition and the second beam condition includes an acceleration voltage of the charged particle beam, and a lens voltage of an electronic lens focusing the charged particle beam or limiting of the charged particle beam by an aperture.

Accordingly, the first and second beam conditions can be properly controlled.

(3) In a third aspect, there is provided the charged particle beam apparatus according to the first or second aspects, wherein the controller is configured to arrange a plurality of position adjustment irradiation frames, which includes the first position adjustment irradiation frame and the second position adjustment irradiation frame, in a line on the surface of the sample.

Accordingly, since the first and second position adjustment irradiation frames are arranged in a line, the correction of the irradiation positions can be easily performed.

(4) In a fourth aspect, there is provided the charged particle beam apparatus according to any one of the first to third aspects, wherein the controller is configured to detect a central position of the first irradiation trace as the predetermined position of the first irradiation trace and detect a central position of the second irradiation trace as the predetermined position of the second irradiation trace.

Accordingly, since the irradiation positions are corrected by using the central positions of the first and second irradiation traces capable of being accurately detected, correction accuracy can be improved.

(5) In a fifth aspect, there is provided the charged particle beam apparatus according to any one of the first to fourth aspects, wherein: the controller is configured to: set the first position adjustment irradiation frame and the second position adjustment irradiation frame at a same position in a first direction and at different positions in a second direction, which is orthogonal to the first direction, on the surface of the sample, the first position adjustment irradiation frame and the second position adjustment irradiation frame respectively having a linear shape extending in the second direction; detect a central position of the first irradiation trace in the first direction as the predetermined position of the first irradiation trace and detect a central position of the second irradiation trace in the first direction as the predetermined position of the second irradiation trace; and correct the position of the second processing irradiation frame based on a position displacement amount between a reference position, which is one of the predetermined position of the first irradiation trace and the predetermined position of the second irradiation trace, and the other of the predetermined position of the first irradiation trace and the predetermined position of the second irradiation trace.

Accordingly, correction accuracy of the irradiation position with respect to the first direction can be improved by using the first and second position adjustment irradiation frames, which respectively have a linear shape extending in the second direction orthogonal to the first direction.

(6) In a sixth aspect, there is provided the charged particle beam apparatus according to any one of the first to fifth aspects, further including a display unit configured to display the image data, wherein the controller is configured to set a central position of a display screen, on which the image data is displayed by the display unit, as a reference position for setting the first position adjustment irradiation frame and the second position adjustment irradiation frame.

Accordingly, in the display screen on which the image data is displayed by the display unit, in a case where a display error is increased as a distance from the central position is increased, the correction amount of the irradiation position can be accurately set compared to a case where the same position in the first direction is set to a position displaced from the central position on the display screen.

What is claimed is:

1. A charged particle beam apparatus comprising:

a stage configured to fix a sample;

a charged particle beam column configured to irradiate the sample with a charged particle beam;

a detector configured to detect a secondary particle emitted from the sample by the irradiation of the charged particle beam;

an image data generating section configured to generate image data indicating two-dimensional distribution of an amount of the secondary particle detected by the detector, by converting the amount of the secondary particle into a luminance signal corresponding to an irradiation position of the charged particle beam on a surface of the sample; and a controller configured to:

set a first processing irradiation frame and a first position adjustment irradiation frame for a first beam condition and a second processing irradiation frame and a second position adjustment irradiation frame for a second beam condition, which is different from the first beam condition, on the surface of the sample in the image data the frames designating beam irradiation areas on the surface of the sample, form a first irradiation trace by irradiating the first position adjustment irradiation frame with the charged particle beam of the first beam condition and a second irradiation trace by irradiating the second position adjustment irradiation frame with the charged particle beam of the second beam condition by using the charged particle beam column, detect the first irradiation trace and the second irradiation trace by the irradiation of the charged particle beam, and correct a position of the second processing irradiation frame, based on a position displacement amount between a predetermined position of the first irradiation trace and a predetermined position of the second irradiation trace.

2. The charged particle beam apparatus according to claim 1, wherein each of the first beam condition and the second beam condition includes an acceleration voltage of the charged particle beam, and a lens voltage of an electronic lens focusing the charged particle beam or limiting of the charged particle beam by an aperture.

3. The charged particle beam apparatus according to claim 1, wherein the controller is configured to arrange a plurality of position adjustment irradiation frames, which includes the first position adjustment irradiation frame and the second position adjustment irradiation frame, in a line on the surface of the sample.

4. The charged particle beam apparatus according to claim 1, wherein the controller is configured to detect a central position of the first irradiation trace as the predetermined position of the first irradiation trace and detect a central position of the second irradiation trace as the predetermined position of the second irradiation trace.

5. The charged particle beam apparatus according to claim 1, wherein the controller is configured to:

set the first position adjustment irradiation frame and the second position adjustment irradiation frame at a same position in a first direction and at different positions in a second direction, which is orthogonal to the first direction, on the surface of the sample, the first position adjustment irradiation frame and the second position adjustment irradiation frame respectively having a linear shape extending in the second direction;

detect a central position of the first irradiation trace in the first direction as the predetermined position of the first irradiation trace and detect a central position of the second irradiation trace in the first direction as the predetermined position of the second irradiation trace; and correct the position of the second processing irradiation frame based on a position displacement amount between a reference position, which is one of the predetermined position of the first irradiation trace and the predetermined position of the second irradiation trace, and the other of the predetermined position of the first irradiation trace and the predetermined position of the second irradiation trace.

6. The charged particle beam apparatus according to claim 1, further comprising a display unit configured to display the image data, wherein the controller is configured to set a central position of a display screen, on which the image data is displayed by the display unit, as a reference position for setting the first position adjustment irradiation frame and the second position adjustment irradiation frame.

* * * * *